United States Patent [19]
Schaefer

[11] Patent Number: 5,751,656
[45] Date of Patent: May 12, 1998

[54] SYNCHRONOUS DRAM MEMORY WITH ASYNCHRONOUS COLUMN DECODE

[75] Inventor: Scott Schaefer, Boise, Id.

[73] Assignee: Micron Technology, Inc., Boise, Id.

[21] Appl. No.: 772,974

[22] Filed: Dec. 23, 1996

Related U.S. Application Data

[63] Continuation of Ser. No. 522,869, Sep. 1, 1995, abandoned.

[51] Int. Cl.$^6$ .................................................... G11C 8/00
[52] U.S. Cl. ........................................ 365/233.5; 365/233
[58] Field of Search ................................ 365/233, 233.5, 365/222

[56] References Cited

U.S. PATENT DOCUMENTS

| | | | |
|---|---|---|---|
| 4,719,602 | 1/1988 | Hag et al. | 365/230 |
| 4,912,679 | 3/1990 | Shinoda | 365/233.5 |
| 4,942,374 | 7/1990 | Wang | 365/233.5 |
| 4,972,374 | 11/1990 | Wang | 365/233.5 |
| 5,047,984 | 9/1991 | Monden | 365/203 |
| 5,179,535 | 1/1993 | Nakayama | 365/189.09 |
| 5,305,283 | 4/1994 | Shimokura et al. | 365/230.08 |
| 5,327,394 | 7/1994 | Green | 365/233.5 |
| 5,414,672 | 5/1995 | Ozeki | 365/233.5 |

*Primary Examiner*—A. Zarabian
*Attorney, Agent, or Firm*—Workman, Nydegger & Seeley

[57] ABSTRACT

Disclosed is a synchronous DRAM memory module with control circuitry that allows the memory module to operate partially asynchronously. Specifically, a circuit is disclosed which utilizes address transition detection to begin decoding the column-address immediately after a new column-address is present on the address bus lines and without waiting for the column-address strobe signal to synchronize with the rising or falling edge of the synchronizing clock signal. Also disclosed is a manner of controlling the latching circuitry whereby each new column-address may be decoded and held within a buffer until the column-address strobe signal notifies the circuitry that the column-address is correct and is to be input into the microprocessor. Thus, each new column-address will be decoded immediately after it is present on the address lines and undesired column-addresses will be discarded, while desired column-addresses are input into the memory array bank immediately upon the presence of the column-address strobe which denotes that the column-address is final. The present invention improves the access times of read and write operations in synchronous DRAM memory by up to a complete clock cycle.

20 Claims, 6 Drawing Sheets

SYNCHRONOUS DRAM MEMORY WITH ASYNCHRONOUS COLUMN DECODE

This application is a continuation application of Ser. No. 08/522,869, filed Sep. 1, 1995 now abandoned.

BACKGROUND OF THE INVENTION

1. The Field of the Invention

The present invention relates to a control circuit and a related method for improving the access time of synchronous DRAM memory. More particularly, the present invention is directed toward decreasing the access time of synchronous DRAM memory through the use of partially asynchronous circuitry.

2. The Relevant Technology

Dynamically refreshable random access memory (DRAM) is currently highly utilized for providing rapid data storage and retrieval in computerized equipment at a reasonable cost. DRAM technology is evolving rapidly. One recent emergence in the DRAM field is the use of synchronous operation of the DRAM control circuitry. FIGS. 1 through 3 illustrate the use of synchronous circuitry to control a DRAM memory cell array. FIG. 1 is a functional block diagram depiction of a synchronous DRAM circuit. Shown therein is an internal control logic module 12, which receives control commands on pins numbered 14 through 26, and which generates the internal controls for either reading data located on pins denoted DQM through DQ8 into the memory bank or producing data from the memory bank onto the pins DQM through DQ8. Typical DRAM addresses are broken into two portions by an external logic control module (not depicted). These two portions comprise a row address and a column-address in order that a narrower bus width can be used. Also shown in FIG. 1 are two paths for the row and column addresses which are typically provided on an internal address denoted by pins A0 through A10 by the memory control module. In response to signals from internal control logic module 12, the row address is routed through the row address decoding circuitry including a row address latch 28, a row multiplexer 30, row address buffers 32, and a row address decoder 34. Row multiplexer 30 is used only where more than 1 bank of memory cells is included. This allows for bank switching, which is an improvement gained by the advance to synchronous DRAM. Typically, two memory array banks, bank 0 and bank 1, are multiplexed by row multiplexer 30 in response to the state of address line A10.

The column-address is routed through the column decoding circuitry, including column-address latch 36, burst counter 38, column-address buffer 40, column decoder 42, and sense amplifiers I/O gating module 44. Data is transferred to or from the memory array bank 1 0 from the data bus, comprising pins DQM through DQ8, through either a data in buffer 46 or a data out buffer 48, as well as a latch 50 and sense amplifiers I/O gating 44. The signals are synchronized with the number 1 clock generator 52 and the number 2 clock generator 54. Mode register 56 is for setting up the memory array bank and control module in one of a predetermined number of functional modes. The refresh circuitry including refresh controller 58, refresh counter 60, and self refresh oscillator and timer 62 provide the dynamic refresh functions necessary at regular intervals to maintain the data voltage level in memory array bank 10.

FIG. 2 is a flow chart describing the operation of the synchronous DRAM and control circuitry of FIG. 1 during a read operation. The process described is a read operation and is discussed for illustration purposes only, as synchronous DRAM read and write operations are commonly known in the art. The first step, denoted at block 60, is the issuance of a read command by the microprocessor or other circuitry which is utilizing memory array bank 1 0 for storage of data. Throughout this document, generalized names will be given to signals which may also be known by other names. For instance, the read command may also be known as the "memory access command." These commands will be recognizable by those skilled in the art.

The read command is typically received by the memory control module which typically comprises a PC decoding chip set. In the next step, denoted at block 62, the address is issued by the microprocessor onto the address bus lines which communicate between the microprocessor and the memory control module. This address is received by the decoder chip set, which divides the address into two portions. In block 64, the row address portion is transmitted to the memory module of FIG. 1 on the internal address bus denoted by pins A0 through A10 on FIG. 1. Thereafter, the decoder chip set issues a RAS signal to the internal control logic 12 of the memory module. This alerts the control logic circuitry that a stable address is present on pins A0 through A10. Once again, the term "RAS signal" isA0 a generic term taken from standard DRAM terminology.

In actual operation, a certain combination of signals on pins 18–24 of FIG. 1 are given, and may otherwise be known as the "bank active command." Control logic circuit 12 then issues the appropriate commands to row address latch 28 and row multiplexer 30, such that the row address can be entered into row address buffers 32 and row decoder 34, and decoded as denoted in block 70.

Thereafter, the proper row address passes into memory array bank 10, and the row is selected as denoted in block 72. Next, the memory control module issues the column address to the memory module of FIG. 1 where it will be present on pins A0 through A10. This is denoted in block 74. In block 76 it is further denoted that the decoder chip set then issues a CAS signal to control logic 12 to alert it that a stable column-address is present on pins A0 through A10.

The CAS signal is also a generalized term denoting a specific combination of signals on pins 18 through 24 of FIG. 1, and may otherwise be termed the "read-write signal." The CAS signal must wait a certain amount of time for setup and hold the row-address to the column-address, which is typically about 20 ns and is denoted $t_{RCD}$. $t_{RCD}$ is further lengthened by the necessity of waiting for the occurrence of a synchronizing clock signal, often increasing the delay up to 30 ns.

Thereafter, control logic circuit 12 generates the internal signals to column-address latch 36 such that the column-address passes through burst counter 38 and into column-address buffer 40 where it is then decoded by column decoder 42. This is depicted by block 80. Once decoded, the column-address passes into memory array bank 10, and the column is selected as depicted in block 82. Once the column has been selected, memory array bank 10 places the requested data on data bus lines DQM through DQ8 through data-out buffer 48, as denoted in block 84. This completes the first read operation. In burst mode, the circuitry will automatically thereafter load a series of adjacently addressed data onto the data bus.

FIG. 3 is a timing diagram depicting the timing of the above-discussed first read operation depicted in FIG. 2. The timing diagram shows the procedure for reading a double burst of information, Doutm and Dout stored in memory array bank 1 0. Thus, the memory array module is operating in burst mode with a burst of 2. In burst mode, a specified number of addresses will be written in sequence, wherein the addresses are located in memory locations having the same row-address, and having column-addresses varying as M and M+n, wherein n is the specific number of addresses set up in mode register 56 seen in FIG. 1 by a command code at the power-up stage to burst at every memory access.

FIG. 3 shows that the memory module of FIG. 1 completes the first read operation denoted by Dout on line DQ, which is the data line, in four clock cycles. The timing diagram of FIG. 3 shows the sequence of the read command from the time the system is enabled, denoted by a high signal level on signal CKE. The sequence comprises the command line entering an active state, while at the same time the row-address is placed on pins A0 through A9. Thereafter, there is a delay while the command line is in the no operation mode, and while the row-address decoder is decoding the row-address. Next, during clock cycle TI, and after delay tRCD, discussed above, the column-address is placed on pins A0 through A9. A read command is issued, which corresponds to the issuance of the CAS signal. Following the read command, there is another delay, denoted by no operation on the command line, and denoted with the delay time tAA, while the column-address is being decoded. Next, the requested data is presented on line DQ and the first read operation is completed. Afterwards, the further burst mode read operations denoted for the first burst $Dout_{M+1}$, are conducted.

Synchronous DRAM is a new and emerging technology that is still being improved upon rapidly. Advantages of synchronous DRAM technology are that it is more accurate, with a reduced tendency to misfire from noise on the control lines. Furthermore, synchronous DRAMs are capable of burst addressing and bank switching, as discussed above, to achieve very high speeds. High speed is the key desired trait in the movement to develop improved memory devices. Nevertheless, synchronous DRAM achieves this higher speed at the sacrifice of certain desirable functions of traditional DRAM technology. For instance, synchronous DRAM is presently incapable of fast page mode addressing. Using fast page mode, current asynchronous DRAM can begin column-addressing as soon as a new column-address is present on the column-address bus lines without waiting for a CAS signal, and a concurrent synchronizing clock signal. This allows for a faster tAA time, the time from when a stable column-address is present on the internal address bus lines until the read or write operation is completed.

Asynchronous DRAM technology typically uses automatic transition detection (ATD) to detect when the new column is present so that column-address decoding can begin immediately thereafter. Using ATD in fast page mode in this manner, multiple reads and writes can be achieved one after the other in a pseudo-burst mode. Synchronous DRAM, on the other hand, is tied to the clock and is incapable of performing such a function. Thus, often a whole clock cycle is lost waiting for the column-address strobe (CAS) to signal the presence of a desired stable column-address after delay tRCD and for CAS to synchronize with the clock so that the decoding of the column-address can begin.

Thus, it becomes apparent that there is a need for a method of improving access times of synchronous DRAM memory to overcome delays, such as the delay between the stable presence of a column-address on the address lines and the generation of a column access strobe signal from the decoder circuitry. Such a step has not been taken in the art, presumably because it would appear to be a step back in the advancement of DRAM technology, which has recently migrated from asynchronous DRAM to synchronous DRAM control, to go back to partially asynchronous DRAM. This is especially the case, as the more efficient burst mode of synchronous DRAM has made the pseudo-burst mode of fast page mode obsolete. From the above discussion, however, it can be seen that it would be a great improvement in synchronous DRAM technology to take an apparent step back and incorporate the asynchronous column-addressing capability of traditional DRAM to the newer synchronous DRAM technology.

SUMMARY AND OBJECTS OF THE INVENTION

The present invention seeks to resolve the above and other problems which have been experienced in the art. More particularly, the present invention constitutes an advancement in the art by providing a synchronous DRAM memory module and control circuitry with partially asynchronous address decoding, which achieves each of the objects listed below.

It is an object of the present invention to provide a memory module which retains the advantages gained by the advancement into synchronized DRAM technology, while also benefitting from the beneficial aspects of fast page mode of asynchronous DRAM technology, which was previously lost by the move to synchronous technology.

It is also an object of the present invention to provide a synchronous DRAM memory module with partially asynchronous operation, whereby the column-address decoding can begin immediately upon the presence of a stable column-address on the address bus lines and without waiting for the column-address strobe to synchronize with the rising or falling edge of the synchronizing clock signal.

It is another object of the present invention to provide such a synchronous DRAM memory module with partially asynchronous column decoding capabilities, whereby the presence of the stable column-address is detected by an address transition detection circuit.

It is a further object of the present invention to provide such a synchronous DRAM memory module with partially asynchronous decoding circuitry, whereby the column-address is fully finished with decoding upon the occurrence of the column-address strobe signal, such that the column-address can be immediately input into the memory module at that time, and thus speeding up the read or write process by up to a full clock cycle.

It is likewise an object of the present invention to provide such a synchronous DRAM with partially asynchronous decoding circuitry with arbitrating signals from the internal control logic circuit, whereby the column-address is latched into the column-address decoding circuitry upon the notification of a stable column-address, and whereby the decoded column-address is allowed into the memory module upon receipt of that signal.

To achieve the foregoing objects, and in accordance with the invention as embodied and described herein, the present invention comprises a synchronous DRAM memory module with decoding circuitry having asynchronous column decoding capability. The present invention comprises means for beginning the decoding of the column-address prior to the synchronization of the column-address strobe and the synchronizing clock signal. This is accomplished with means for sensing the occurrence of a new column-address on the address lines in order that the column-address decoding circuitry may begin decoding a new column-address as soon as a new column-address appears on the address bus lines, independently of the synchronizing means.

In one embodiment, the means for beginning the decoding of the column-address independent of the synchronizing of the column-address strobe and the synchronizing clock signal comprises an address transition detection circuit. The address transition detection circuit allows the column-address to be sent to the column-address decoder immediately upon the arrival of a stable column-address on the address bus lines of the memory module. At the arrival thereafter of the column-address strobe signifying that the column-address is final and is desired to be entered into the memory array bank, the column-address will be already decoded and can be immediately transferred into the memory array bank.

In a typical read process using the present invention, the following steps will occur. First, the read command is issued by the microprocessor. The read command is typically received by a memory control module, which in current microcomputers, presently the largest user of DRAM memory, comprises a PC decoding chip set. Thereafter, the address is issued on the external address bus lines and is transferred to the memory control module. The memory control module then breaks the address into two portion, a row-address portion and a column-address portion, and issues the row-address portion to the DRAM memory module.

Next the memory control module issues a row-address strobe signal (RAS) to denote the presence of a stable row-address on the address bus lines of the DRAM memory module. Upon the issuance of RAS, the column-address latch is set to be transparent. That is, it is set to allow new addresses to flow through it upon notification by an address transition circuit of the presence of a new address. At the same time, the row-address is latched into the row-address latch. Then, the row-address is decoded and the row is selected. The memory control module then issues the column-address to the DRAM memory module.

Immediately upon the presence of a new column-address on the address bus lines of the DRAM memory module, the address transition circuit detects the presence and alerts the column-address latch. The column-address latch allows the address in, and the column-address decoder then begins decoding the column-address. Thereafter, when the memory control module finally issues a column-address strobe signal (CAS), the column-address is already fully decoded and can be sent immediately to the memory array bank. The occurrence of CAS also latches the post decode latch, which allows the decoded column-address to pass into the memory array bank. The column is then selected, and the desired data is transferred from the memory array bank to the data-out buffer and the data bus lines. This completes the read operation. Write operations are similar, with the exception that data is transferred into the memory array bank after the column-address passes into the memory array bank through a data-in buffer.

With the use of the present invention, the data will be present on the data out lines up to a full clock cycle earlier. This is because the delay between the presence of a stable column-address and the appearance of data on the data bus is shortened because the decoder now does not need to wait until the occurrence of CAS to begin decoding.

The present invention can be used with multiple memory array bank switching and can be operated in burst mode, wherein the memory is set to decode a series of column-addresses, column $_m$ to column$_{m+n}$, where n is the preselected number of addresses to be decoded. Thus, the present invention recoups previously lost advantages of asynchronous DRAM and retains other benefits gained by the advancement to synchronous DRAM technology.

Thus, it can be seen that the present invention, while retaining the benefits of the high speed of synchronous DRAM technology, also incorporates the benefits of asynchronous DRAM technology and in particular, the fast page mode. As a consequence, in many cases, a full clock cycle can be omitted from the read and write operation, since decoding can begin earlier than the occurrence of the column-address strobe and its synchronization with the internal synchronous clock. In 66 MHz machines for instance, this will result in an increase for every read and write operation of approximately 15 nanoseconds. This is a significant improvement in the access time of these devices, which typically require about 60 nanoseconds for the entire first data out operation.

These and other objects and features of the present invention will-become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention comprises a synchronous DRAM memory array and method of addressing and controlling the memory array in a partially asynchronous manner. The results of this invention are decreased access times of the DRAM memory module for read and write operations. Thus, in accordance with the present invention, it has been found that beneficial characteristics of synchronous DRAM can be retained while recouping certain favorable characteristics of asynchronous DRAMs in the same memory array that were formerly lost to the synchronous DRAM technology.

In order to control the memory array in a partially asynchronous manner, a means for beginning the decoding of the column-address independently of the synchronizing clock signal is used. This further comprises, in a preferred embodiment, means for sensing the occurrence of a new column-address on the memory address lines in order that column-address decoding circuitry may begin decoding a new column-address as soon as the new column-address appears on the address bus lines, independently of the synchronizing means.

Figure 1:
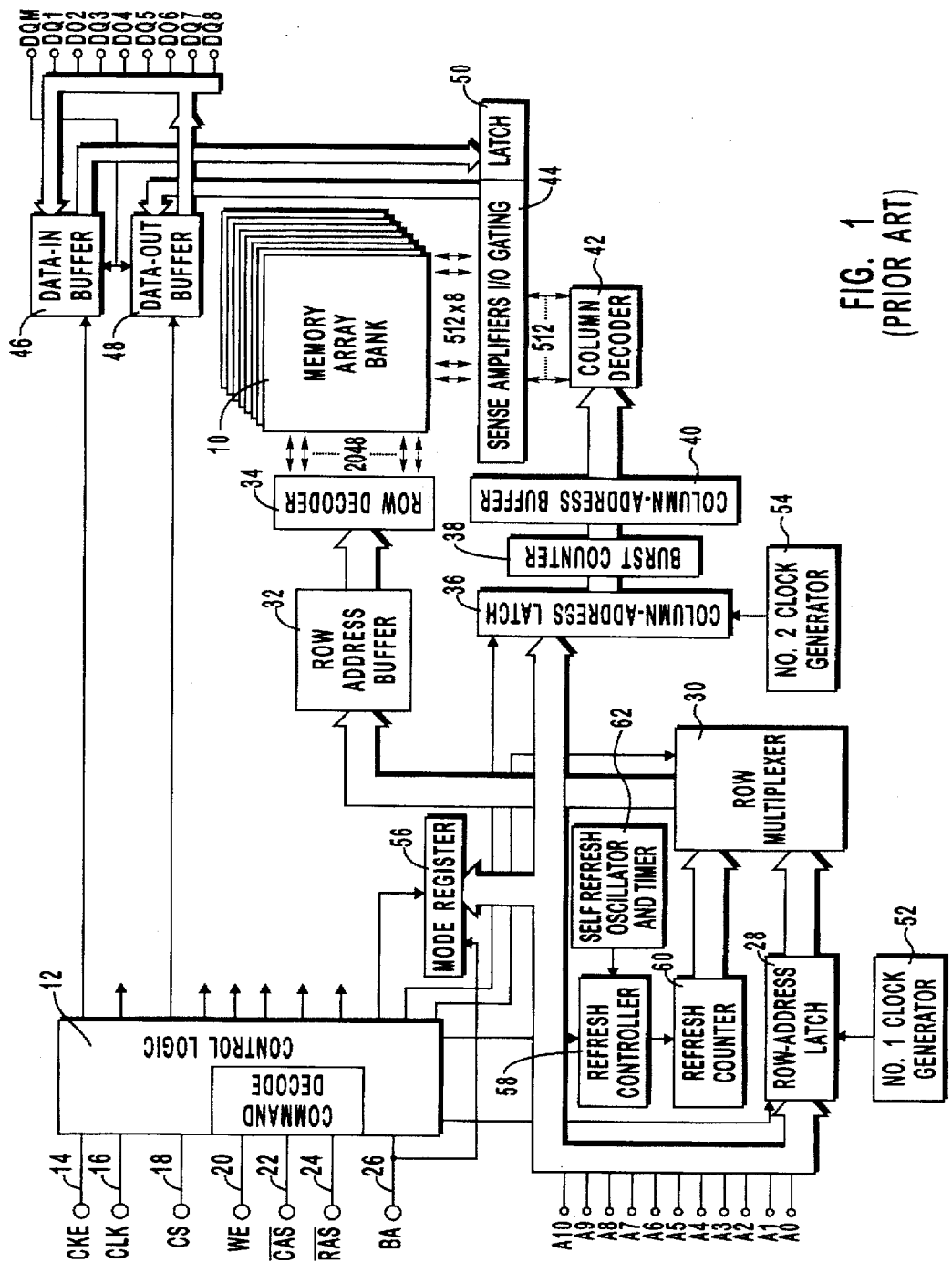
FIG. 1 is a functional block diagram depicting a synchronous DRAM memory array and control logic module of the prior art.
Figure 4:
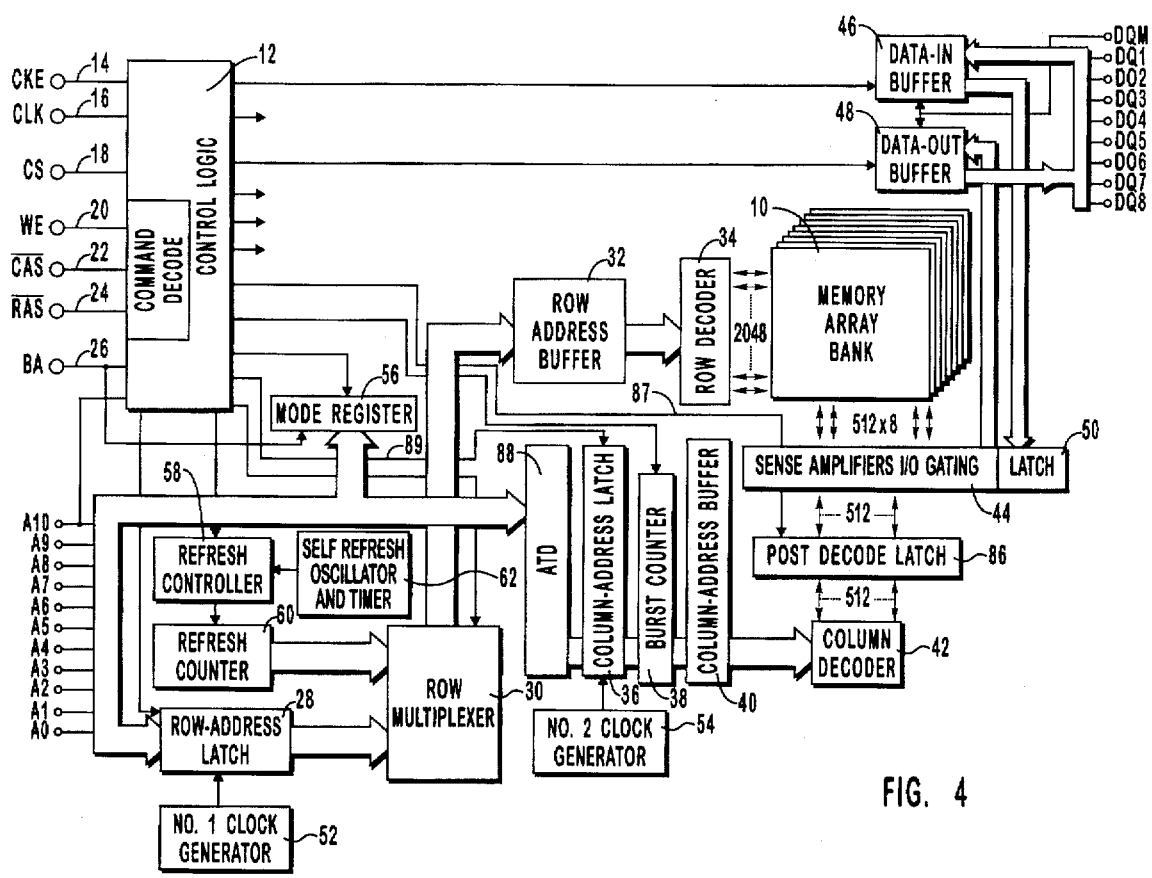
FIG. 4 is a functional block diagram of the synchronous DRAM memory with asynchronous column decoding of the present invention.
Figure 6:
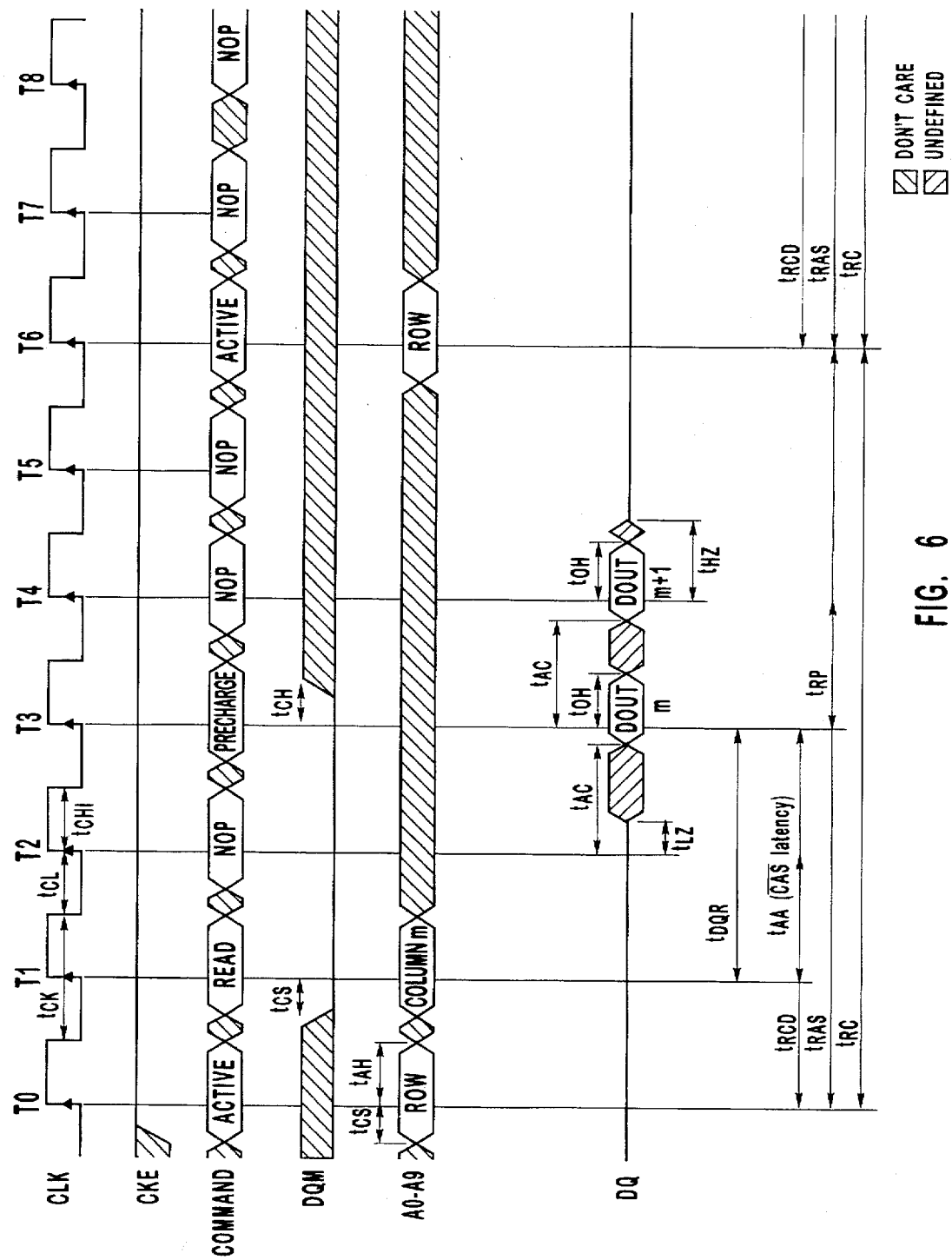
FIG. 6 is a timing diagram showing the timing of the read function outlined in FIG. 5 for the circuitry of the present invention illustrated by the functional block diagram of FIG. 4.

In one embodiment of the present invention, illustrated in FIG. 6, the means for beginning the decoding of the column-address comprises circuitry that begins the decoding of the column-address as soon as the column is stable on the address bus lines. This is done asynchronously of the clock, and in most instances will improve the access time for read and write commands by a full clock cycle. Shown in FIG. 4 is memory array bank 10 in communication with data bus DQM-DQ8 and with the column and row decoding circuitry, together with control logic module 12 for controlling the decoding circuitry, as discussed above with respect to FIG. 1. Also shown are address bus lines A0 through A10. As also discussed, these are connected to row-address latch 28, then to row multiplexer 30, row-address buffer 32, row decoder 34, and then to memory array bank 1 0. They are also connected to column-address latch 36, then to burst counter 38, column-address buffer 40, column decoder 42, sense amplifiers and I/O gating 44, and finally to the memory array bank 10.

Figure 2:
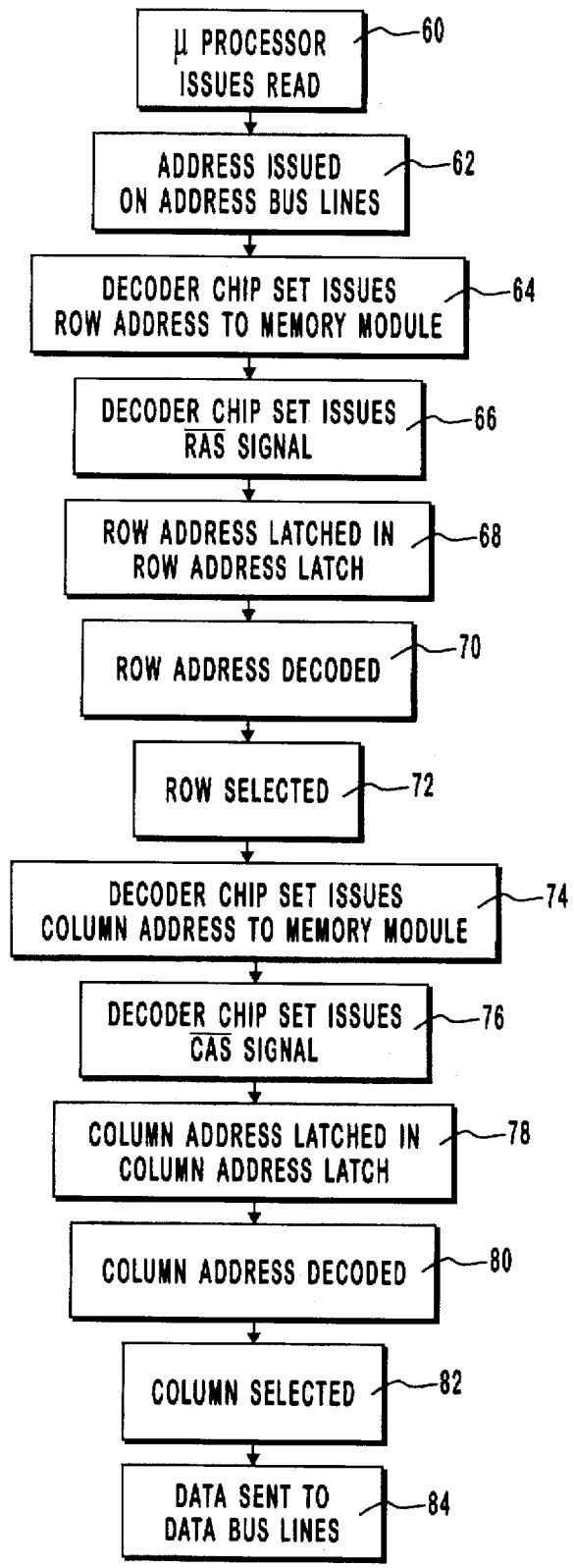
FIG. 2 is a flow chart depicting a typical read operation of the memory array and control logic module of FIG. 1.
Figure 3:
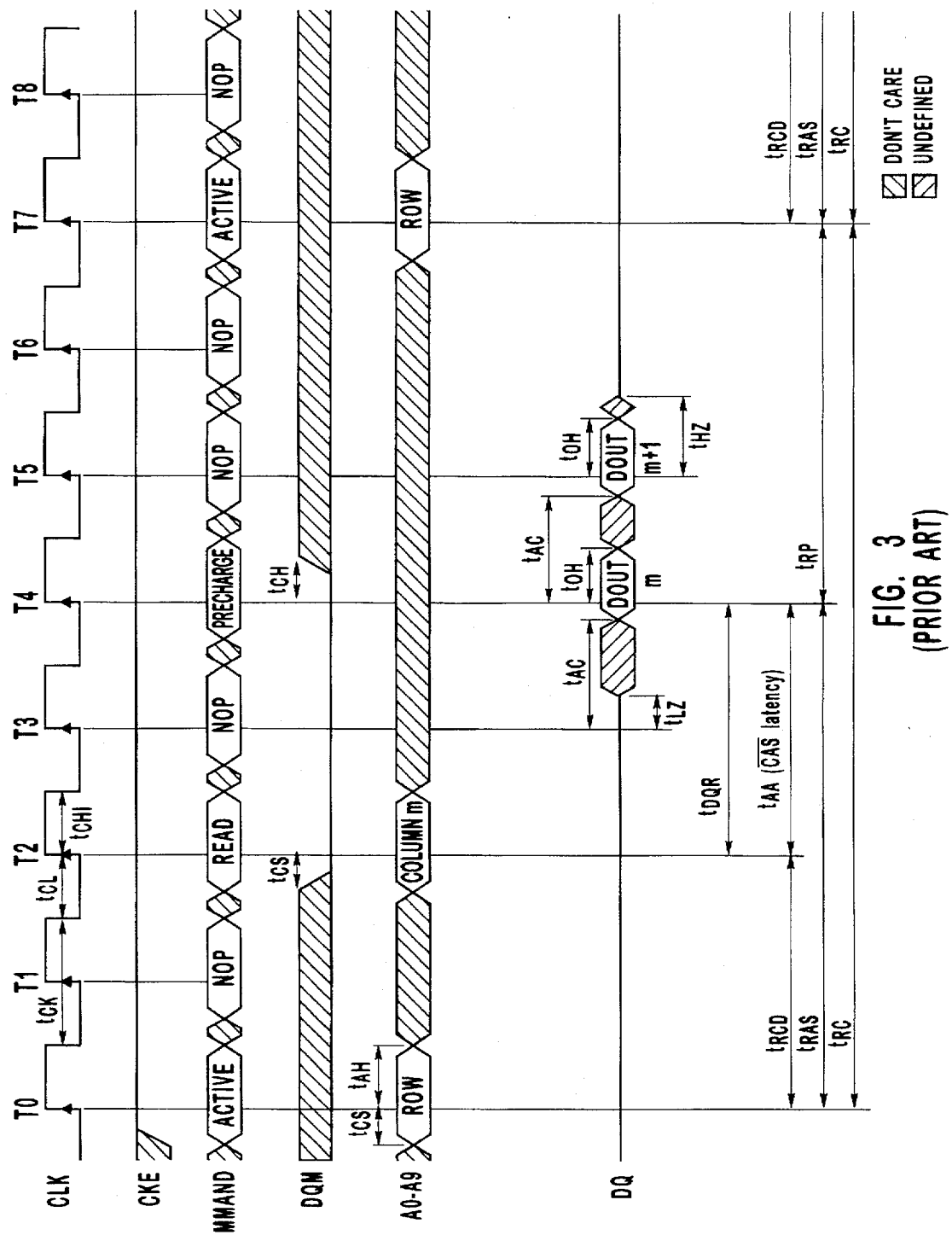
FIG. 3 is a timing diagram showing the delays inherent in the read operation of the flow chart of FIG. 2 and the functional block diagram of FIG. 1.

New additions, in accordance with the present invention, comprise a post decode latch 86, with a control line 89 for communication with the column-address strobe command generated in control logic circuit 12. Also added to accomplish the present invention is an address transition detection circuit 88 for notifying column-address latch 36 of the presence of a new address on address bus lines A0–A10. Using the circuitry of FIG. 4, the circuit designer can be given the choice of operating in standard synchronous DRAM mode, as illustrated in the flow chart of FIG. 2, or of operating in partially asynchronous mode, illustrated in the flow chart of FIG. 5.

Figure 5:
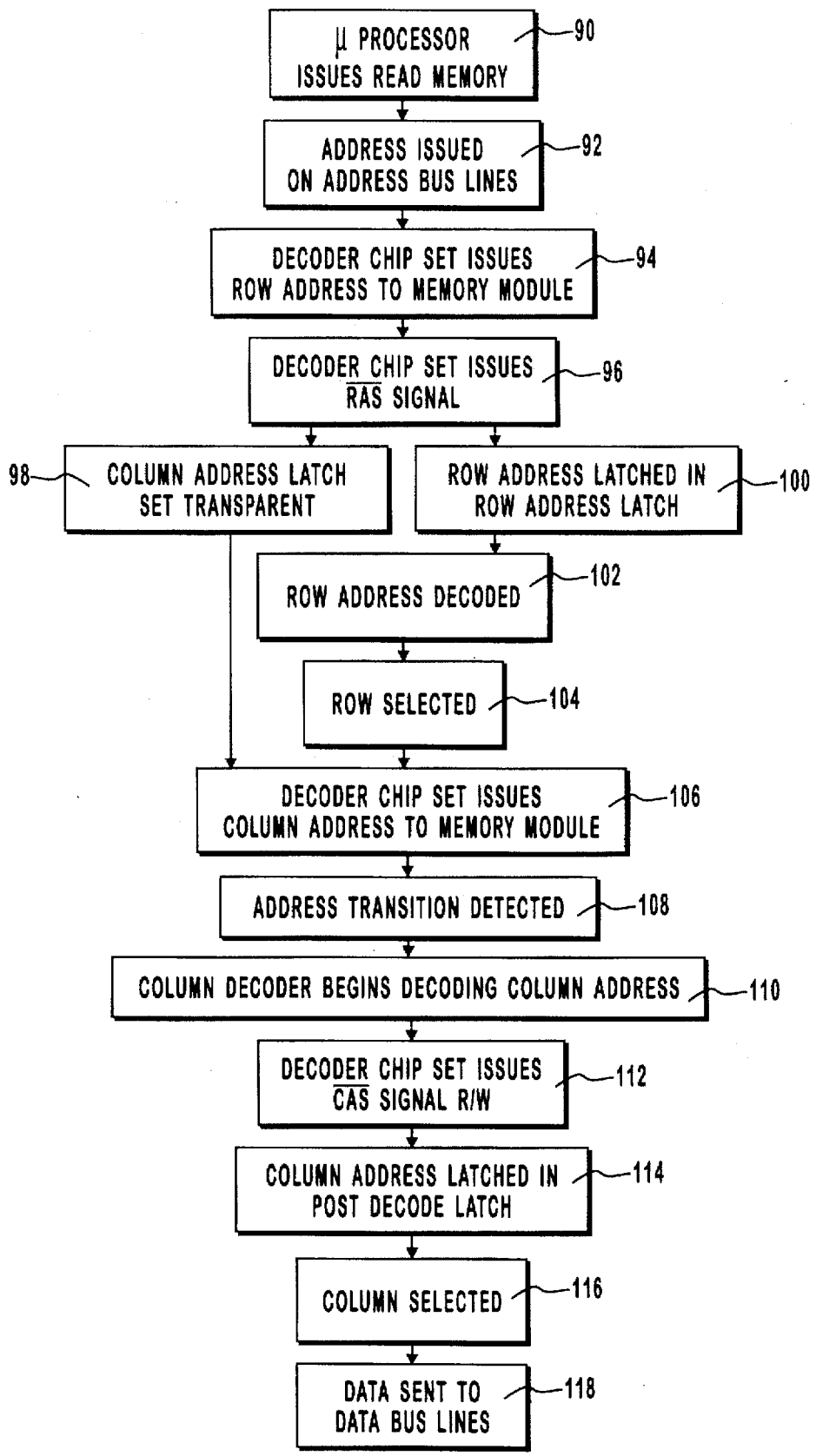
FIG. 5 is a block diagram delineating the steps of a read operation of synchronous is DRAM memory with asynchronous column decoding of the present invention which is depicted by the fictional block diagram of FIG. 4.

Shown in FIG. 5 is a flow chart of the partially asynchronous operation of the circuitry of FIG. 4. Therein, block 90 denotes the generation by the microprocessor of a read or write command. For illustration purposes, only the read command is being shown and discussed, as it will be clear from the discussion to one skilled in the art how to thereby accomplish a write command under the present invention. After the read command is issued, a valid address is placed on the external address bus line, as denoted in block 92. The read command and the address to be read to are both received by the decoding chip set. The decoding chip set then breaks the address in two portions, one being the row-address and the second portion being the column-address. This is typically done in order to fit a large number of addresses on a limited number of bus lines, as also discussed above. The row-address is then sent out over address bus lines A0–A10, as denoted in block 94.

After the foregoing, as denoted in block 96, a row-address strobe (RAS) signal is sent to row-address latch 28. The row-address is then latched into row-address latch 28, as denoted in block 100, and then passes into row-address decoder 34, where it is decoded, as denoted in block 102. It is then passed onto memory array 10 and the row is selected as denoted at block 104.

Concurrently, under the present invention, column-address latch 36 also receives the RAS signal, and in response becomes transparent. That is, after the row-address is latched, it allows any new addresses to pass through into the decoder circuitry upon notification by address transition detection circuit 88. Address detection transition circuit 88 thereafter detects the presence of a new address subsequent to the row-address latch and every new address thereafter appears on address bus lines A0–A10, as denoted in block 108, and notifies column-address latch 36, which then latches in the column-address. This occurs upon the issuance of a column-address, as denoted at block 106.

Thus, the column decoding circuit begins decoding the new address every time a new address appears, which is done asynchronously of the clock signal. When the column-address strobe (CAS) does arrive, as denoted in block 110, the column-address will have anticipated it and will be already completely decoded. Each new column-address will be decoded immediately after it is present on the address lines and undesired column-addresses will be discarded, while desired column-addresses are input into the memory array bank immediately upon the presence of the column-address strobe which denotes that the column-address is final.

In one case, where the frequency of the synchronizing clock is 66 MHz, a clock cycle can be eliminated for every read or write command, saving approximately 15 nanoseconds. Upon the arrival of CAS, the decoded address is latched into the memory array as denoted in block 114, after which the memory array will produce the data from the designated memory location and transfer it onto the data bus through data-out buffer 48, as denoted at block 118. Alternatively, if a write command is being performed, the memory array will receive the data on the data bus and transfer it into data-in buffer 46, and thence into the designated memory location of memory array bank 10. Multiple sequential addresses can be read from or written to using the burst mode of synchronous DRAM technology.

FIG. 6 shows the advantages of the present invention in a timing diagram. Shown therein is the row-address becoming present on address bus lines A0 through A9 at clock T0. Thereafter, after a minimal setup and hold time and before clock Ti, the column-address becomes present on address bus lines A0 through A9. This will be immediately decoded, as discussed above, shortening delay time $t_{AA}$. Thus, by clock Ti, a CAS command can be issued rather than at clock T2, and once issued, the read will occur instantly, rather than being delayed for decoding. Thus, a $t_{CAC}$ delay is realized, as in fast page mode, that varies from $t_{AA}$. In most cases, this will save approximately 8 to 15 nanoseconds. Thereby, faster $t_{CAC}$ access times are achieved by beginning the decoding prior to the mutual occurrence of the positive clock edge and the CAS signal, in order to anticipate the CAS signal. If the CAS signal is not sent, and a new address is provided on the address bus lines, the automatic transition detection circuit will detect the new address and will notify the column decode latch, which will then allow the column-address to flow into the buffer, replacing the previous address, and decoding will begin over again.

From the foregoing, it can be seen that the benefits of synchronous DRAM can be retained while gaining the added benefits that were lost in the advancement to synchronous operation. Specifically, the benefits of fast page mode in asynchronous DRAM can now be incorporated into synchronous DRAM circuitry.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of addressing an array of memory cells which are arranged in rows and columns and which are addressed by a row-address and a column-address of a selected memory cell to be communicated with by a microprocessor, the row-address and the column-address becoming available to a row-address decoding circuit and column-address decoding circuit at separate times, the method comprising:

generating an internal signal at predetermined repeating intervals;

beginning one of a column-address decoding operation and a row-address decoding operation in synchronization with the internal signal, such that said one of the column-address decoding operation and the row-address decoding operation begins only a selected amount of time after a generation of the internal signal; and beginning the other of said one of a column-address decoding operation and a row-address decoding operation independently of the internal signal.

2. A method as recited in claim 1, wherein the internal signal is a clock signal operating at a selected frequency.

3. A method as recited in claim 1, wherein the beginning of said one of the column-address decoding operation and the row-address decoding operation begins in response to a control signal issued only after the generation of the internal signal.

4. A method as recited in claim 1, wherein the internal signal is a clock signal operating at a selected frequency, and wherein the beginning of said one of the column-address decoding operation and the row-address decoding operation begins in response to a control signal issued only after the generation of the internal signal.

5. A method as recited in claim 4, wherein the signal occurring independently of the internal signal is a row-address strobe issued by a decoding circuit to indicate the presence of a stable row-address on an address bus that is in electrical communication with the row-address decoding circuit and the column-address decoding circuit.

6. A method as recited in claim 4, further comprising the issuance of a column-address strobe issued by a decoding circuit after a generation of the internal signal to indicate the presence of a stable column-address on an address bus that is in electrical communication with the row-address decoding circuit and the column-address decoding circuit, and wherein the column-addressing operation is started prior to the issuance of the column-address strobe.

7. A method of addressing an array of memory cells as recited in claim 1, wherein the row-address decoding operation begins in synchronization with the internal signal, and wherein the column-address decoding operation begins independently of the internal signal.

8. A method of addressing an array of memory cells as recited in claim 1, wherein the memory array comprises an array of synchronously dynamically refreshable random access memory cells.

9. A method of addressing an array of memory cells as recited in claim 1, further comprising conducting a plurality of sequential operations in burst mode in which contiguous groups of memory cells are addressed successively with a timing that is coordinated with the internal signal.

10. A method as recited in claim 7, wherein beginning the other of said one of the column-address decoding operation and the row-address decoding operation further comprises:

setting a column-address latch to a transparent state such that each new column-address occurring on the address bus enters the column-address latch; and latching a column-address into the column-address latch upon sensing the occurrence of the column-address on the address bus.

11. A method of addressing an array of memory cells which are arranged in rows and columns and which are addressed by a row-address and a column-address of a selected memory cell to be communicated with by a microprocessor, the row-address and column-address being present at separate times on an address bus, the method comprising:

decoding a row-address in synchronization with an internal signal generated at predetermined repeating intervals;

setting a column-address latch to a transparent state that each new column-address present on the address bus enters the column-address latch;

latching a column-address into the column-address latch upon sensing the presence of the column-address on the address bus;

decoding the column-address independently of the internal signal generated at the predetermined repeating intervals; and conducting a plurality of operations in burst mode in which contiguous groups of memory cells are addressed successively with a timing that is coordinated with a series of consecutive addresses in response the internal signal.

12. A method as recited in claim 11, wherein the presence of a the column-address on the address bus is sensed by an address transition detection circuit.

13. A method as recited in claim 11, wherein the internal signal is a clock signal operating at a selected frequency.

14. A method as recited in claim 11, wherein decoding the row-address begins in response to a control signal issued only after the generation of the internal signal.

15. A method as recited in claim 11, wherein the internal signal is a clock signal operating at a selected frequency, and wherein decoding the row-address begins in response to a control signal issued only after the generation of the internal signal.

16. A method as recited in claim 15, wherein the signal occurring independently of the internal signal is a row-address strobe issued by a decoding circuit to indicate the presence of a stable row-address on the address bus.

17. A method as recited in claim 16, further comprising the issuance of a column-address strobe issued by the decoding circuit after a generation of the internal signal to indicate the presence of a stable column-address on the address bus, and wherein the column-addressing operation is started prior to the issuance of the column-address strobe.

18. A method of addressing an array of memory cells as recited in claim 11, wherein the memory array comprises an array of synchronously dynamically refreshable random access memory cells.

19. A method of addressing an array of memory cells which are arranged in rows and columns and which are addressed by a row-address and a column-address of a selected memory cell to be communicated with by a microprocessor, the row-address and column-address being present at separate times on an address bus, the address bus being in electrical connection with a column-address latch and a row-address batch, the method comprising:

generating an internal signal at predetermined repeating intervals;

issuing a row-address on the address bus;

setting the column-address latch to a transparent state, such that each column-address appearing on the address bus is entered into the column-address latch;

beginning decoding of the row-address in synchronization with the internal signal;

issuing a column-address on the address bus;

detecting the presence of the column-address on the address bus with an address transition detection module;

latching the column-address in the column-address latch in response to the detection of the presence of the column-address on the address bus;

beginning decoding of the column-address upon latching the column-address latch and independently of the internal signal; and conducting a plurality of sequential operations in burst mode in which contiguous groups of memory cells are addressed successively with a timing that is coordinated with the internal signal.

20. A method of addressing an array of memory cells as recited in claim 19, wherein the memory array comprises an array of synchronously dynamically refreshable random access memory cells.

* * * * *

UNITED STATES PATENT AND TRADEMARK OFFICE
CERTIFICATE OF CORRECTION

PATENT NO. : 5,751,656

DATED : May 12, 1998

INVENTOR(S) : Scott Schaefer

It is certified that error appears in the above-identified patent and that said Letters Patent is hereby corrected as shown below:

Col. 1, line 22, after "circuitry." insert a paragraph break

Col. 1, line 53, after "bank" change "1 0" to --10--

Col. 2, line 5, after "bank" change "1 0" to --10--

Col. 2, line 22, after "logic" insert --module--

Col. 2, line 24, after "is" delete --A0--

Col. 2, line 40, after "logic" insert --module--

Col. 2, line 44, after "the" change ""read-write" to --read/write--

Col. 2, line 67, after "information," change "Doutm" to --$Dout_m$--

Col. 3, line 1, after "bank" change "1 0" to --10--

Col. 3, line 19, before "discussed" change "tRCD" to --$t_{RCD}$--

Col. 3, line 24, before "while" change "tAA" to --$t_{AA}$--

Col. 3, line 46, after "faster" change "tAA" to --$t_{AA}$--

Col. 3, line 59, after "delay" change "tRCD" to --$t_{RCD}$--

Col. 5, line 25, after "two" change "portion" to --portions--

UNITED STATES PATENT AND TRADEMARK OFFICE
CERTIFICATE OF CORRECTION

PATENT NO. : 5,751,656
DATED : May 12, 1998
INVENTOR(S) : Scott Schaefer

It is certified that error appears in the above-identified patent and that said Letters Patent is hereby corrected as shown below:

Col. 6, line 14, after "In" change "66" to --6b--

Col. 6, line 51, after "synchronous" delete --is--

Col. 6, line 53, after "the" change "fictional" to --functional--

Col. 7, line 21, after "bank" change "10" to --10--

Col. 7, line 27, after "32," change "row" to --row-address--

Col. 7, line 28, after "bank" change "1 0" to --10--

Col. 7, line 61, after "discussed" delete the slash

UNITED STATES PATENT AND TRADEMARK OFFICE
CERTIFICATE OF CORRECTION

PATENT NO. : 5,751,656
DATED : May 12, 1998
INVENTOR(S) : Scott Schaefer

It is certified that error appears in the above-identified patent and that said Letters Patent is hereby corrected as shown below:

Col. 8, line 45, after "clock" change "Ti" to --T1--

Col. 8, line 48, after "clock" change "Ti" to --T1--

Col. 10, line 39, after "of" delete --a--

Col. 11, line 5, after "row-address" change "batch" to --latch--

Signed and Sealed this

Thirteenth Day of April, 1999

Attest:

Q. TODD DICKINSON

Attesting Officer

Acting Commissioner of Patents and Trademarks